US010467366B2

(12) United States Patent
Xu et al.

(10) Patent No.: US 10,467,366 B2
(45) Date of Patent: Nov. 5, 2019

(54) METHODS AND SYSTEMS FOR SIMULATING HIGH-SPEED LINK DESIGNS

(71) Applicant: Oracle International Corporation, Redwood Shores, CA (US)

(72) Inventors: Shengbo Xu, San Jose, CA (US); An-Jui Shey, Fremont, CA (US); Chao Wang, Milpitas, CA (US)

(73) Assignee: Oracle International Corporation, Redwood Shores, CA (US)

( * ) Notice: Subject to any disclaimer, the term of this patent is extended or adjusted under 35 U.S.C. 154(b) by 582 days.

(21) Appl. No.: 15/294,559

(22) Filed: Oct. 14, 2016

(65) Prior Publication Data

US 2018/0107775 A1    Apr. 19, 2018

(51) Int. Cl.
*G06F 17/50* (2006.01)

(52) U.S. Cl.
CPC ................... *G06F 17/5036* (2013.01)

(58) Field of Classification Search
CPC .................................................. G06F 17/5036
USPC ........................................................ 703/14
See application file for complete search history.

(56) References Cited

U.S. PATENT DOCUMENTS

| 6,053,947 | A | 4/2000 | Parson |
| 6,882,966 | B2 | 4/2005 | Ryu et al. |
| 7,210,087 | B2 | 4/2007 | Mukai et al. |
| 7,693,691 | B1 * | 4/2010 | Tao ...................... G06F 17/5009 375/267 |
| 8,196,075 | B1 | 6/2012 | Garrault et al. |
| 8,738,347 | B2 | 5/2014 | Yoshimura et al. |
| 8,893,068 | B1 | 11/2014 | Kho et al. |
| 2003/0229482 | A1 * | 12/2003 | Cook .................. G06F 17/5045 703/14 |
| 2010/0329319 | A1 * | 12/2010 | Dai .................... G01R 31/3171 375/224 |

* cited by examiner

*Primary Examiner* — Dwin M Craig
(74) *Attorney, Agent, or Firm* — Fish IP Law, LLP (57) ABSTRACT

Systems and methods for generating a simulation model that simulates a SerDes system comprising components from different SerDes designs are provided. At least one component from the SerDes system comes from a proprietary SerDes design having an existing simulation model for the overall proprietary SerDes design. The existing simulation model includes software codes that inter-mingle the characteristics of the different components of this proprietary SerDes design. Characteristics of at least one SerDes component are extracted and modularized from a proprietary simulator to form a proprietary SerDes component model. Optionally, a standard SerDes component model can also be generated using an existing IBIS-AMI model. A new layer of abstraction is introduced on top of the different SerDes component model types. The simulation system also provides a solver implementation that not only conforms to the strict requirements of the IBIS-AMI specification but also handles the idiosyncrasies of the proprietary model data.

20 Claims, 7 Drawing Sheets

METHODS AND SYSTEMS FOR SIMULATING HIGH-SPEED LINK DESIGNS

FIELD OF THE INVENTION

The field of the invention is circuit simulation processes.

BACKGROUND

The background description includes information that may be useful in understanding the present invention. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition or use of that term provided herein, the definition or use of that term provided herein applies and the definition or use of that term in the reference does not apply.

As hardware companies continually push the performance of their systems and integrated chips (ICs), achieving the required communication bandwidth is becoming increasingly challenging. System level bandwidth requirements have approximately doubled every generation, and keeping pace requires aggressively designing for higher data rates and lane counts. This leads to greater signal densities, more package and board layers, more intricate routing topologies, and increased serializer/deserializer (SerDes) tuning complexity. As a result, properly managing and understanding the complexity and variation in these designs becomes paramount.

For this, designers rely on modeling and simulation. Fast and accurate simulation is a crucial part of the design methodology and affords designers a wealth of opportunities. For example, through accurate simulation, designers can ascertain the impact of critical parameter variations, find trends and explain anomalies during debug, prepare for system bring-up and tuning, and perform proof-of-concept simulations for architecture improvement.

Furthermore, because system design is a collaborative effort between many teams, a notable challenge in the industry is providing a flexible, unified platform to simulate one part of the system with the components designed by the other groups.

Industry has considered or implemented several different alternative simulation solutions. Time-domain simulation (SPICE) is the de facto standard for transistor-level circuit simulation and could be extended into system simulation. In the past, transient simulation with SPICE transmitter and receiver models along with lossy transmission line parameters have been used to generate eye diagrams at the receiver input and then compared to a predefined receiver eye mask.

Frequency-domain simulation tools such as Keysight ADS are available for providing a native way to handle frequency-dependent effects and S-parameters. These tools normally make use of simplified linear driver/receiver models, but many also include support for behavioral modeling through the Input/output Buffer Information Specification-Algorithmic Modeling Interface (IBIS-AMI) standard. The IBIS-AMI specification provides a method to encapsulate SerDes intellectual property (e.g., implementation details, algorithms, etc.) in interoperable, transportable models that cannot be reverse engineered.

Some IC manufacturers have proprietary simulators designed specifically for their own transmitter and receiver devices. Each tool contains built-in models that can accurately describe the SerDes electrical and algorithmic behavior at each end of the link, and the simulator is custom tailored to handle these models. Current methodologies rely on a mix of these existing tools, and it is not uncommon for different teams to be simulating their models with different tools.

However, existing simulation solutions are suboptimal. Transient SPICE simulation is too slow and cannot simulate the millions of bits needed to predict link performance. It is also difficult to incorporate the algorithmic behavior of the transmitter and receiver circuitry, including equalization and clock data recovery. As data rates have increased and signal integrity through the analog channel continues to degrade rapidly, it is no longer sufficient to evaluate the eye without considering the advanced nonlinear equalization techniques used in today's SerDes modules.

Proprietary simulators are inherently limited due to the focus on their own design technologies. This exclusivity is acceptable only if all of the SerDes blocks (e.g., transmitters and receivers) are designed by one vendor. The proprietary tools can apply highly tailored algorithms and significant shortcuts in their solver methods that work well with the known embedded driver/receiver models. The downside is that these models are typically not discrete modules that can be readily substituted or exported; rather, the model representations are interwoven throughout the simulation code. External designs cannot be easily integrated into these simulators, nor can the embedded models be readily ported for use in commercial tools.

Commercial electronic design automation (EDA) tools for link simulation can support IBIS-AMI models, but unfortunately, constructing IBIS-AMI models may require significant development time. From a tool perspective, the black box nature of these IBIS-AMI models means that simulators must follow rigid computational approaches based on the model standards and what data is available externally. In addition, access to intermediate results and internal model data (such as adaptation behavior) is often limited, since the IBIS-AMI specification only stipulates for the output waveform and clock information to be returned from the model. The limitations prevent designers from precisely analyzing the behavior of the individual SerDes blocks and consequently reducing designers' capability to correct and improve on the SerDes designs.

Thus, there remains a need for a system and method that allows testers to efficiently build sophisticated simulation systems for simulating system links that are made up of SerDes blocks designed by different groups of engineers.

SUMMARY OF THE INVENTION

The following description includes information that may be useful in understanding the present invention. It is not an admission that any of the information provided herein is prior art or relevant to the presently claimed invention, or that any publication specifically or implicitly referenced is prior art.

The subject matter provides apparatus, systems, and methods which generate a simulation model that simulates a SerDes system comprising components from different SerDes designs, where at least one component from the SerDes system comes from a proprietary SerDes design having an existing simulation model for the overall proprietary SerDes design. The different SerDes designs can be generated by the same or different SerDes designers. In some embodiments, the at least one component is either a transmitter or a receiver. The existing simulation model includes software codes that intermingle the characteristics of the different components of this proprietary SerDes design.

In some embodiments, characteristics of at least one SerDes component are extracted and modularized from a proprietary simulator to form a proprietary SerDes component model. Optionally, a standard SerDes component model can also be generated using an existing IBIS-AMI model. A new layer of abstraction is introduced on top of the different SerDes component model types. The simulation system also provides a solver implementation that not only conforms to the strict requirements of the IBIS-AMI specification but also handles the idiosyncrasies of the proprietary model data.

Various objects, features, aspects and advantages of the subject matter will become more apparent from the following detailed description of preferred embodiments, along with the accompanying drawing figures in which like numerals represent like components.

The following discussion provides many example embodiments of the subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

DETAILED DESCRIPTION

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

It should be noted that any language directed to a computer system should be read to include any suitable combination of computing devices, including servers, interfaces, systems, databases, agents, peers, engines, controllers, or other types of computing devices operating individually or collectively. One should appreciate the computing devices comprise a processor configured to execute software instructions stored on a tangible, non-transitory computer readable storage medium (e.g., hard drive, solid state drive, RAM, flash, ROM, etc.). The software instructions preferably configure the computing device to provide the roles, responsibilities, or other functionality as discussed below with respect to the disclosed apparatus. In especially preferred embodiments, the various servers, systems, databases, or interfaces exchange data using standardized protocols or algorithms, possibly based on HTTP, HTTPS, AES, public-private key exchanges, web service APIs, known financial transaction protocols, or other electronic information exchanging methods. Data exchanges preferably are conducted over a packet-switched network, the Internet, LAN, WAN, VPN, or other type of packet switched network. Computer software that is "programmed" with instructions is developed, compiled, and saved to a computer-readable non-transitory medium specifically to accomplish the tasks and functions set forth by the disclosure when executed by a computer processor.

One should appreciate that the disclosed techniques provide many advantageous technical effects including enabling SerDes designers of an organization to generate a simulation system that can handle both the organization's own internal SerDes models as well as potential IBIS-AMI models from external vendors, and allows the internal SerDes models to work together with IBIS-AMI SerDes models in mixed topology configurations.

One aspect of the subject matter provides apparatus, systems, and methods to generate a simulation model that simulates a SerDes system (also known as a link system that at the minimum includes a transmitter, a channel, and a receiver) comprising components from different SerDes designs, where at least one component from the SerDes system comes from a proprietary SerDes design having an existing simulation model for the overall proprietary SerDes design. The different SerDes designs can be generated by the same or different SerDes designers. In some embodiments, the at least one component is either a transmitter or a receiver. The existing simulation model includes software codes that inter-mingle the characteristics of the different components of this proprietary SerDes design.

In some embodiments, characteristics of at least one SerDes component are extracted and modularized from a proprietary simulator model (a proprietary SerDes model) that models a complete SerDes system to form a proprietary SerDes component model (e.g., a proprietary transmitter model, a proprietary receiver model, etc.). Optionally, a standard SerDes component model can also be generated using an existing IBIS-AMI model. A new layer of abstraction is introduced on top of the different SerDes component model types. The simulation system also provides a solver implementation that not only conforms to the strict requirements of the IBIS-AMI specification but also handles the idiosyncrasies of the proprietary model data.

The proprietary component models are re-factored into distinct software classes—a derived transmitter class and a derived receiver class—in an object-oriented programming scheme, which are derived from a base transmitter class or a base receiver class. Each of the derived transmitter class and the derived receiver includes an object constructor that reduces a set of configurable model inputs to a set of ABCD parameters (frequency-domain), impulse response waveform (time-domain), and algorithmic settings to be passed into different response functions. For a transmission line circuitry, the ABCD parameters are known in the art as standard parameters for describing characteristics of the transmission line. For example, parameter A represents a voltage ratio value, parameter B represents a short circuit resistance value, parameter C represents an open circuit conductance value, and parameter D represents a current ratio value.

As mentioned above, a standard SerDes component model can also be generated using an existing IBIS-AMI model. In some embodiments, an abstract representation of the transmitter and receiver are derived from the same base transmitter class and base receiver class as those for the proprietary component classes. For a derived component class generated for an IBIS-AMI model, the configurable parameters specify the desired IBIS file, model name, and AMI parameter-value pairs from the shared library. The IBIS-AMI model's analog characteristics are represented by an ABCD parameter in the frequency-domain, computed from the model's provided impedance and capacitance data or from an on-die 4 port S-parameter model. The algorithmic functions are loaded from an external shared library that includes specific APIs for an IBIS-AMI model.

Figure 1:
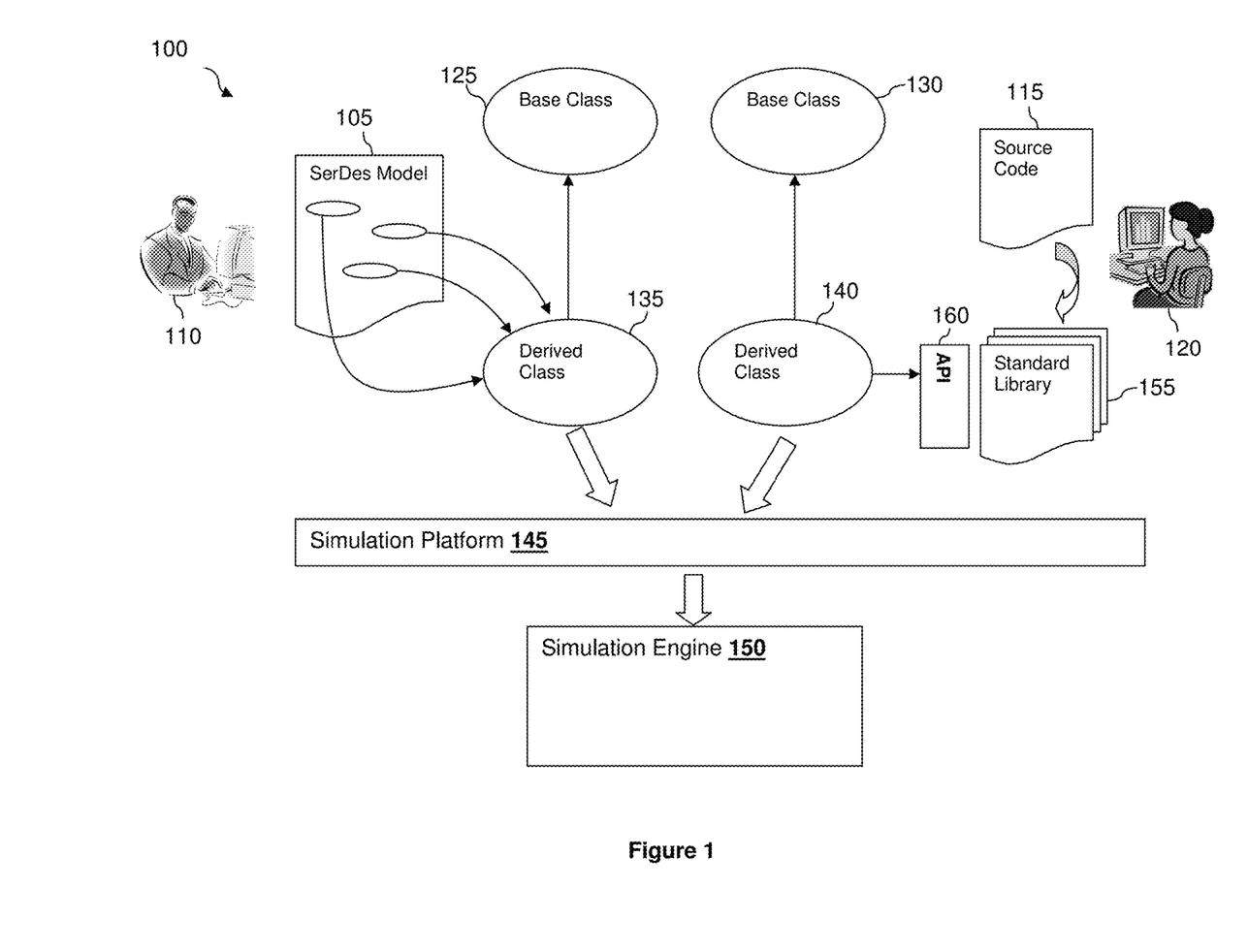
FIG. 1 illustrates an operating environment for generating a simulation engine based on a transmitter design from a proprietary SerDes model and a receiver design from a standard receiver model.

FIG. 1 illustrates an exemplary operating environment 100 for generating a simulation system of some embodiments. The operating environment 100 includes a proprietary SerDes model 105 that models a proprietary SerDes (link) design created by one or more SerDes designers 110. In some embodiments, the SerDes model 105 is a software model that can be represented in a source code format. The SerDes designers 110 can be, for example, from a product development group of a company. The design of a SerDes system includes different component designs, such as a transmitter design, a channel design, and a receiver design. As mentioned above, characteristics of the transmitter design, the channel design, and the receiver design often intermingles with each other within the SerDes model 105.

The operating environment 100 also includes a standard SerDes component model 115 that conforms to an industry standard. Examples of such industry standard for SerDes simulation models include IBIS-AMI, and others. In some embodiments, the standard SerDes component model 115 is generated by a different group of SerDes designers 120 to model a SerDes component design, such as a transmitter design or a receiver design. The group of SerDes designers 120 and the group of SerDes designers 110 can be from different development groups within the same company. Alternatively, the group of SerDes designers 120 and the group of SerDes designers 110 can be from different companies.

In order to enable a component design (e.g., a transmitter design, a receiver design, etc.) from the proprietary SerDes model 105 and the standard SerDes component model 115 to work together, a base transmitter class 125 and a base receiver class 130 that are designed to work together in a simulation system is provided. The base transmitter class 125 and the base receiver class 130 provide an abstraction layer with a standard interface that allow classes that are derived from these base classes to work together within a simulation system.

Since the transmitter and receiver designs share many common features and functions, and it is the implementation of these features and functions that differentiate the two, in some embodiments, the base transmitter class 125 and base receiver class 130 are derived from the same base component class (not shown). The base component class (and thus each of the base transmitter class 125 and base receiver class 130) can have one or more constructor function calls for instantiating a new instance of the class, a concatenation function call for combining instantiated transmitter objects or instantiated receiver objects in parallel, and a plus function call for overriding the "+" operator. The base component class (and thus each of the base transmitter class 125 and base receiver class 130) can also have one or more of the following variables: an szterm variable that denotes a number of terminals for the transmitter or receiver object; an impulse variable that denotes a collection of waveform objects containing the impulse response data for each terminal of the transmitter or receiver object; a tpe variable that denotes an edge rate when FIR/FFE coefficients are provided instead of an actual impulse response waveform; a term variable that denotes an abcdNet object containing the ABCD network parameter data for the transmitter or receiver termination circuit; and a desc variable that denotes a descriptive language for the transmitter or receiver object.

In some embodiments, custom classes can be derived from the base transmitter class 125 and the base receiver class 130. In this example, a custom transmitter class can be derived from the base transmitter class and a custom receiver class can be derived from the base receiver class. In some embodiments, one (e.g., a human simulation engine builder or a computer system such as a simulation building system can be programmed to) the simulation engine builder) can derive a custom transmitter class 135 from the base transmitter class 125 and a custom receiver class 140 from the base receiver class 130. In some embodiments, from the base transmitter class 125 or the base receiver class 130, one can derive either a custom proprietary SerDes component class or a custom standard SerDes component class. A proprietary SerDes component class is one that is derived by extracting SerDes component characteristics from a proprietary SerDes model, such as the proprietary SerDes model 105, and implementing the extracted component characteristics into the derived class. On the other hand, a standard SerDes component class is one that is implemented by extracting characteristics based on a standard SerDes component model, such as the standard SerDes component model 115, and by calling different function calls (e.g., APIs 160) from a standard library 155 of the standard SerDes component model 115.

In this example, a transmitter design from the proprietary SerDes model 105 and a standard receiver model 115 are used to construct a simulation engine. As such, the custom transmitter class 135 is derived from the base transmitter class 125 by first extracting transmitter characteristics from the proprietary SerDes model 105. In some embodiments, the simulation building system is programmed to present the proprietary SerDes model 105 to a simulation engine builder (e.g., a SerDes designer or EDA developer) in a source code format. In other embodiments, the simulation building system is programmed to present the proprietary SerDes model 105 to the simulation engine builder in a graphical representation that displays different characteristics of the proprietary SerDes model 105.

The simulation building system is a computer software application that either automatically builds simulation engines or assists a human simulation engine builder to generate the simulation engine. In some of these embodiments, the simulation building system is programmed to generate the graphical representation based on the source code representation of the proprietary SerDes model 105 and present the graphical representation of the proprietary SerDes model 105 to the simulation engine builder. The simulation engine builder is programmed to identify different transmitter characteristics from the graphical representation and implement the custom transmitter class 135 based on the extracted transmitter characteristics. Alternatively, the simulation building system is programmed to automatically identify the different transmitter characteristics based on the source code of the proprietary SerDes model 105.

In some embodiments, to extract transmitter characteristics from the proprietary SerDes model 105, an output driver impedance point can be identified in the proprietary simulation model 105 and signal transformation characteristics can be extracted. For example, a simulation engine builder can (or the simulation building system is programmed to) identify an output driver impedance point in the proprietary simulation model 105 and extract signal transformation characteristics in a workflow within the proprietary simulation model 105 before the output driver impedance point.

In some embodiments, the extraction of transmitter characteristics includes extracting time-domain characteristics of the transmitter design from the proprietary SerDes model 105. In some of these embodiments, extracting the time-domain characteristics includes extracting both linear and non-linear effects of the transmitter design from the proprietary SerDes model 105. Furthermore, the extraction of transmitter characteristics also includes extracting frequency-domain characteristics of the transmitter design from the proprietary SerDes model 105. For example, the simulation engine builder can (or the simulation building system is programmed to) first identify portions of the proprietary SerDes model 105 that corresponds to different transmitter circuitries (e.g., TX FIR circuitry, TX DAC circuitry, etc.). The simulation engine builder can (or the simulation building system is programmed to) then model a TX FIR circuit within the proprietary SerDes model 105 as a linear effect represented in the time-domain as an impulse response. The simulation engine builder can (or the simulation building system is programmed to) model a TX DAC circuit within the proprietary SerDes model 105 as a linear effect but characterized in the frequency domain as an S-parameter.

Once all of the characteristics associated with the transmitter have been extracted from the proprietary SerDes model 105, a custom transmitter class can be derived. For example, the simulation engine builder can (or the simulation building system is programmed to) derive the transmitter class 135 by implementing the extracted characteristics within the transmitter class 135 according to the interface specification defined by the base transmitter class 125. The extracted characteristics can be implemented within the new transmitter class 135 in different ways. As mentioned above, the base transmitter class 125 defines a set of variables and function call interfaces. In some embodiments, the simulation engine builder can (or the simulation building system is programmed to) directly transfer the portions of the source code that correspond to the extracted transmitter characteristics from the source code representation of the proprietary SerDes model 105 to implement, for the transmitter class 135, the different function calls and variables defined in the base transmitter class 125 based on the extracted characteristics. In other embodiments, the simulation engine builder can (or the simulation building system is programmed to) define additional variable parameters and/or implement additional function calls within the transmitter class 135 based on the extracted characteristics.

Furthermore, in some embodiments, the simulation building system is programmed to provide an interface for implementing the extracted characteristics within the transmitter class 135. In these embodiments, the specification defined by the base transmitter class 125, including the variables (definitions of the variables), function calls (parameters, definitions of the function calls, etc.), are provided a priori to the simulation building system. Once a characteristic is identified on the graphical representation of the proprietary SerDes model 105 and is indicated by the simulation engine builder which characteristic it corresponds to, the simulation building system of some embodiments is programmed to automatically implement that characteristic within the new transmitter class 135.

In some embodiments, a piecewise linear (PWL) waveform outputting module can be implemented at an intermediate point within the transmitter model. For example, the simulation engine builder can (and the simulation building system is programmed to) implement, within the custom transmitter class 135, a piecewise linear (PWL) waveform outputting module that outputs a PWL waveform at an intermediate point within the transmitter model that the custom transmitter class 135 represents. The PWL waveform can then be used by other simulation program such as SPICE for simulation of smaller design blocks. This is possible only because of the tight integration of the proprietary SerDes modle 105, which enables internal probing of the waveform propagation within the transmitter class 135.

In some embodiments, a jitter generation module can be implemented within the custom transmitter class. For example, the simulation engine builder can (and the simulation building system is programmed to) implement, within the custom transmitter class 135, a jitter generation module that first generates a PLL power spectral density using spectral profiles of a noise source of the transmitter design from the proprietary SerDes model 105 and block level transfer functions of the transmitter design from the proprietary SerDes model 105. The jitter generation module then converts a phase locked-loop (PLL) power spectral density to a probability density function and generates jitter in the time-domain of the custom transmitter class 135 based on the probability density function. The jitter is represented by bit duration changes in the time domain waveform, which enables accurate modeling of the effect of time domain PLL phase noise on the transmitted signal.

As someone who is skilled in the art can appreciate, the new transmitter class 135 is a custom transmitter class specifically modeled after the transmitter design from the proprietary SerDes model 105. Other custom transmitter class that models the transmitter design of another proprietary SerDes model can be implemented in a similar manner. Additionally, although in this example, a custom proprietary transmitter class is built, a custom proprietary receiver class can also be built using a base receiver class (e.g., the base receiver class 130, etc.) in a similar manner, by extracting characteristics of the receiver design from a proprietary SerDes model. Details of how to extract receiver characteristics from a proprietary SerDes model are described below.

In addition to deriving a custom transmitter class 135 from the base transmitter class 125, a custom receiver class 140 can also be derived from the base receiver class 130. In this example, the custom receiver class 140 is derived using a standard receiver model 115, such as an IBIS-AMI model. In some embodiment, the simulation engine builder can derive the custom receiver class 140 by implementing function calls associated with a library (e.g., a DLL library) of the standard receiver model 115. In other embodiments, the simulation building system is also programmed to automatically implement the custom receiver class 140 based on an input of the standard receiver model 115. In these embodiments, the simulation building system includes a set of rules for implementing a custom component class (e.g., a custom transmitter class, a custom receiver class, etc.) based on a standard component model such as an IBIS-AMI model. Although in this example, a standard receiver model 115 is used to derive a custom receiver class from the base class 130, it is noted that a custom transmitter class can also be derived based on the base transmitter class 125 based on a standard transmitter model using the same technique.

In addition to deriving a new transmitter class and a new receiver class, a custom channel class for the simulation engine can be implemented. For example, the simulation engine builder can (or the simulation building system is programmed to) also implement a custom channel class for the simulation engine based on a standard or custom channel model. The custom channel class implementation can include reading a channel model file (or files) and configuring a matrix that represents the behavior of the channel design.

The derived transmitter class 135 and derived receiver class 140 (and the custom channel class) can then be plugged into a simulation platform 145 to generate a simulation engine 150. For example, the simulation engine builder can (or the simulation building system is programmed to) derive the custom transmitter and receiver class from the base transmitter and base receiver classes, and then instantiate instances of the derived custom transmitter and receiver classes within the simulation engine 150 for simulating the new SerDes model. In some embodiments, the simulation engine builder (or the simulation building system can be programmed to) design the base transmitter class 125 and base receiver class 130 to conform with the specification of the simulation platform 145 such that any transmitter class and receiver class that are derived from the base classes 125 and 130, and then instantiated, can work with the simulation platform 145 to generate a simulation engine 150 that models after a SerDes design using the corresponding transmitter and receiver designs. In this example, the resulting simulation engine 150 models after a SerDes design that includes the transmitter design from the proprietary SerDes model 105 and the receiver design from the standard receiver model 115. As defined herein, a simulation engine is a software program that simulates behavior of the design of hardware component, in this instance, a SerDes design. The simulation engine 150 is programmed to simulate different circumstances (by receiving different parameters and inputs) with the SerDes design, generate outputs (resulting outputs or intermediate outputs based on the SerDes design), and provide analysis to the outputs to enable to SerDes designer to correct any problems or improve the contemplating SerDes design.

As mentioned before, in some embodiments, the linear frequency-dependent characteristics of the transmitter and receiver can be extracted and stored as ABCD parameters in the derived transmitter class and derived receiver class, respectively. Using these ABCD parameters, which describe the voltage and current relationship between left and right side ports, and combined with the ABCD parameters for the passive channel, the generated simulation engine can determine a corresponding relationship between current and voltage at all ports. Based on a voltage input stimulus at one transmitter-side port with all other inputs tied low, the currents at each right side port can be computed from the IV characteristics. Then, the simulation engine builder can (or the simulation building system is programmed to) program the simulation engine to use the individual ABCD parameters (for the transmitter, receiver, and channel elements) to propagate the currents and voltages backward to all previous nodes all the way to the left side ports. This generates the end-to-end frequency responses of the system, describing the behavior from any input transmitter-side port to any output node (e.g. at input or output of the passive channel). The simulation engine builder can (or the simulation building system is programmed to) program the simulation engine to convert the transfer functions in the frequency domain to a set of impulse responses in the time domain by inverse Fourier transform. Thus, once all frequency domain behavior is translated into the time domain, the simulation engine builder can (or the simulation building system is programmed to) program the simulation engine to propagate the input waveforms through the link starting from the transmitter. Within the transmitter, the derived class can process the waveform either directly by convolution or using a non-linear algorithmic function (if present). The output is then convolved with the computed impulse response for the analog channel to compute the signal at the input of the receiver. Finally, within the receiver, the derived class can process the waveform either directly by convolution or using a non-linear algorithmic function (if present) to generate the final signal at the receiver output.

When the new SerDes model involves a derived transmitter class or a derived receiver class that is based on a standard (e.g., IBIS-AMI) model, the simulation engine builder can (or the simulation building system is programmed to) program the simulation engine to interface with the model libraries by calling the provided APIs (e.g., AMI_Init and AMI_GetWave function calls). The simulation engine can make these library function calls during the signal propagation. For example, the simulation engine can execute the AMI_Init function call to initialize the model, then pass the input waveform to the AMI_GetWave call, which returns the response at the output of the IBIS-AMI driver.

Figure 2:
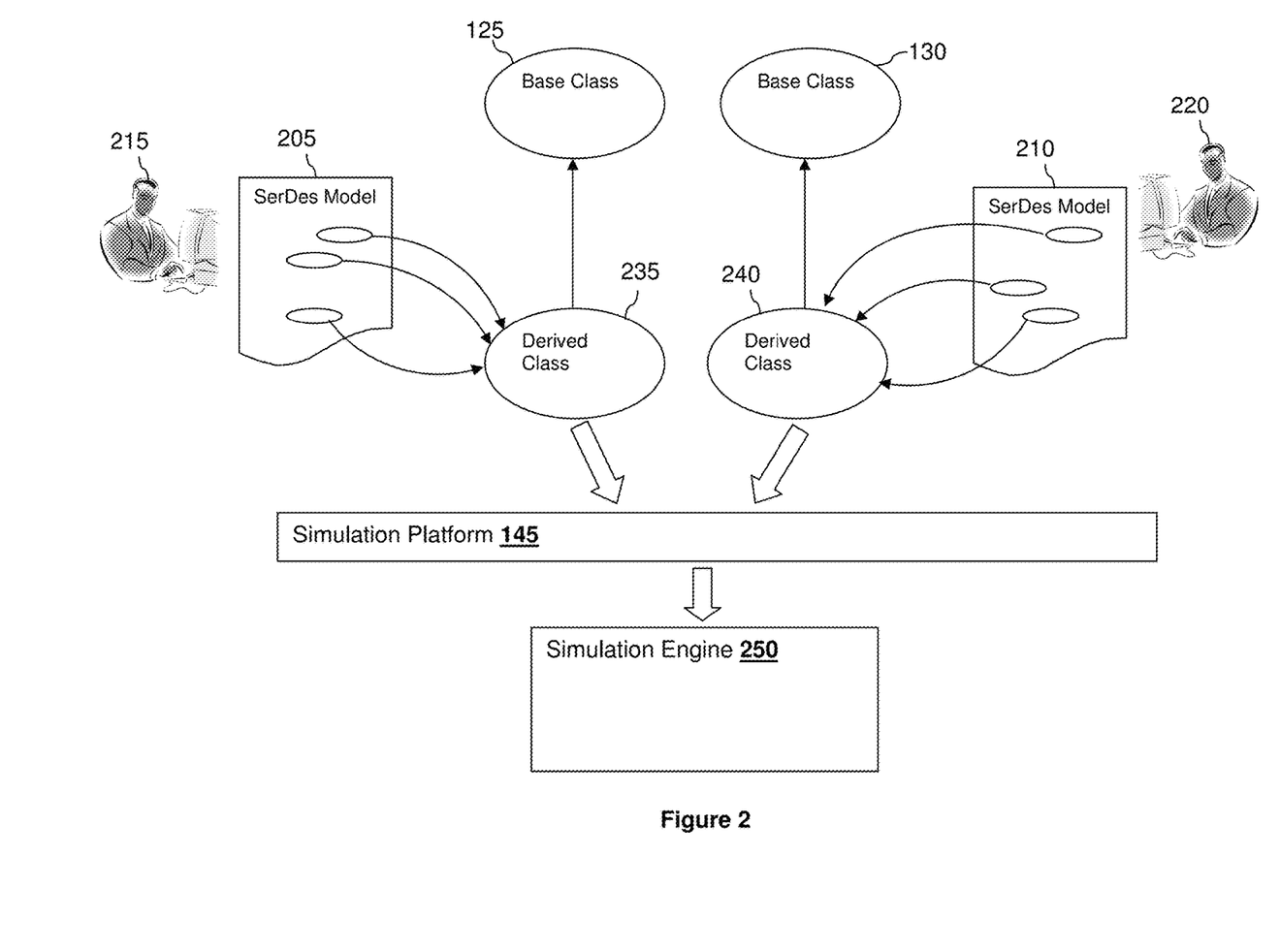
FIG. 2 illustrates an operating environment for generating a simulation engine based on a transmitter design and a receiver design from two different proprietary SerDes models.

Instead of generating a simulation engine that models after component designs from a proprietary SerDes model and a standard component model, simulation engines can also be generated from two different SerDes models using the methods and systems described above. FIG. 2 illustrates generating a different simulation engine based on a transmitter design and a receiver design that are from two different proprietary SerDes models using the same approach. As shown in FIG. 2, the same base transmitter class 125, the same base receiver class 130, and the same simulation platform 145 as shown in FIG. 1.

In FIG. 2, two different proprietary SerDes models—proprietary SerDes models 205 and 210—are presented. The two proprietary SerDes models 205 and 210 were generated based on different SerDes designs having different component designs (e.g., different transmitter designs, different receiver designs, etc.). For example, the proprietary SerDes model 205 may be generated to model after a first SerDes design and the proprietary SerDes model 210 may be generated to model after a second SerDes design. These two proprietary SerDes models can be generated by the same group of SerDes designers, by different groups of SerDes designers within the same organization, or by groups of SerDes designers from different organizations.

Similar to the example shown in FIG. 1, in order to generate a new simulation engine, custom transmitter class and custom receiver class are derived from the base transmitter class 125 and base transmitter class 130, respectively. In this example, the transmitter design from the proprietary SerDes model 205 and the receiver design from the proprietary SerDes model 210 will be used for in a final SerDes design. Therefore, a custom transmitter class 235 needs to be derived based on the transmitter design from the proprietary SerDes model 205, and a custom receiver class 240 needs to be derived based on the receiver design from the proprietary SerDes model 210, in order to construct a simulation engine that models the new SerDes design.

To implement the custom transmitter class 235, the simulation engine builder can (or the simulation building system is programmed to) extract transmitter characteristics from the proprietary SerDes model 205, and implement the extracted transmitter characteristics within the custom transmitter class 235 using the same techniques described in FIG. 1 and according to the interface/specification set forth by the base transmitter class 125. In addition, the simulation builder can (or the simulation building system is programmed to) also extract receiver characteristics from the proprietary SerDes model 210, and implement the extracted receiver characteristics within the custom receiver class 240. In some embodiments, to extract the receiver characteristics from the proprietary SerDes model 210, the simulation engine builder can (or the simulation building system is programmed to) first identify portions of the proprietary SerDes model 210 that corresponds to different receiver circuitries (e.g., RX CTLE circuitry, RX DFE circuitry, RX VGA circuitry, etc.). The simulation engine builder can (or the simulation building system is programmed to) then model the RX CTLE, RX DFE, and RX VGA circuits within the proprietary SerDes model 210 as both linear and non-linear effects. The simulation engine builder can (or the simulation building system is programmed to) capture the linear effects of these RX circuits by transfer functions, while modeling the non-linear effects in the time-domain. The RX CTLE, RX DFE, and RX VGA exhibit non-linear effects where the response varies nonlinearly with the input signal amplitude. Alternatively, nonlinear circuits may include effects where the response changes over time. Examples of receiver components that exhibit this type of non-linear effects include the digital logic for adaptation loops of the RX DFE and RX VGA circuits, which modify the current incoming waveform but the applied effect adapts over time. In some embodiments, the proprietary SerDes model 210 can be presented to a simulation engine builder (e.g., a SerDes designer) in a source code format. In other embodiments, the proprietary SerDes model 210 can be presented to the simulation engine builder in a graphical representation that displays different characteristics of the proprietary SerDes model 105.

In some of these embodiments, the simulation building system is programmed to generate the graphical representation based on the source code representation of the proprietary SerDes model 210 and present the graphical representation of the proprietary SerDes model 210 to the simulation engine builder. The simulation engine builder can identify different receiver characteristics from the graphical representation and implement the custom receiver class 240 based on the extracted receiver characteristics. Alternatively, the simulation building system is programmed to automatically identify the different receiver characteristics based on the source code of the proprietary SerDes model 210.

In some embodiments, to extract the receiver characteristics from the proprietary SerDes model 210, a simulation engine builder can (or the simulation building system can be programmed to) identify an input termination network point in the proprietary simulation model 210 and extract signal transformation characteristics in the proprietary simulation mode 210 after the input termination network point.

In some embodiments, the extraction of receiver characteristics includes extracting time-domain characteristics of the receiver design from the proprietary SerDes model 210. In some of these embodiments, extracting the time-domain characteristics includes extracting both linear and non-linear effects of the receiver design from the proprietary SerDes model 210.

Furthermore, the extraction of receiver characteristics also includes extracting frequency-domain characteristics of the receiver design from the proprietary SerDes model 210.

Once all of the characteristics associated with the receiver have been extracted from the proprietary SerDes model 210, a custom receiver class can be derived from the based receiver class. In this example, the simulation engine builder can (or the simulation building system is programmed to) derive the receiver class 240 by implementing the extracted receiver characteristics within the receiver class 240 according to the interface specification defined by the base receiver class 130. The extracted characteristics can be implemented within the new receiver class 240 in different ways. As mentioned above, the base receiver class 130 defines a set of variables and function call interfaces. In some embodiments, the simulation engine builder can (or the simulation building system is programmed to) directly transfer the portions of the source code that corresponds to the extracted receiver characteristics from the source code representation of the proprietary SerDes model 210 to implement, for the receiver class 240, the different function calls and variables defined in the base receiver class 130 based on the extracted characteristics. In other embodiments, the simulation engine builder can (or the simulation building system is programmed to) define additional variable parameters and/or implement additional function calls within the receiver class 240 based on the extracted characteristics.

Furthermore, in some embodiments, the simulation building system as mentioned above can be programmed to provide an interface for implementing the extracted characteristics within the receiver class 240. In these embodiments, the specification defined by the base receiver class 130, including the variables (definitions of the variables), function calls (parameters, definitions of the function calls, etc.), are provided a priori to the simulation building system. Once a characteristic is identified on the graphical representation of the proprietary SerDes model 210 and is indicated by the simulation engine builder which characteristic it corresponds to, the simulation building system of some embodiments is programmed to automatically implement that characteristic within the new receiver class 240.

As mentioned before, in some embodiments, the simulation engine builder (or the simulation building system is programmed to) extract the linear frequency-dependent characteristics of the transmitter and receiver and store these characteristics as ABCD parameters in the derived transmitter class and derived receiver class, respectively. Using these ABCD parameters, which describe the voltage and current relationship between left and right side ports, and combined with the ABCD parameters for the passive channel, the simulation engine builder can (or the simulation building system is programmed to) determine a corresponding relationship between current and voltage at all ports and implement this relationship within the simulation engine. Based on a voltage input stimulus at one transmitter-side port with all other inputs tied low, the simulation engine builder can (or the simulation building system is programmed to) compute the currents at each right side port from the IV characteristics. Then, the simulation engine builder can (or the simulation building system is programmed to) program the simulation engine to use the individual ABCD parameters (for the transmitter, receiver, and channel elements) to propagate the currents and voltages backward to all previous nodes all the way to the left side ports. This generates the end-to-end frequency responses of the system, describing the behavior from any input transmitter-side port to any output node (e.g. at input or output of the passive channel). The simulation engine builder can (or the simulation building system is programmed to) program the simulation engine to convert the transfer functions in the frequency domain to a set of impulse responses in the time domain by inverse Fourier transform. Thus, once all frequency domain behavior is translated into the time domain, the simulation engine builder can (or the simulation building system is programmed to) program the simulation engine to propagate the input waveforms through the link starting from the transmitter. Within the transmitter, the simulation engine builder can (or the simulation building system is programmed to) implement the derived class to process the waveform either directly by convolution or using a non-linear algorithmic function (if present). The simulation engine builder can (or the simulation building system is programmed to) implement the derived class to convolve the output with the computed impulse response for the analog channel to compute the signal at the input of the receiver. Finally, within the receiver, the simulation engine builder can (or the simulation building system is programmed to) implement the derived class to process the waveform either directly by convolution or using a non-linear algorithmic function (if present) to generate the final signal at the receiver output.

In some embodiments, a piecewise linear (PWL) waveform outputting module can be implemented within the custom receiver class 240. For example, the simulation engine builder can (or the simulation building system can be programmed to) implement, within the custom receiver class 240, a piecewise linear (PWL) waveform outputting module that outputs a PWL waveform at an intermediate point within the receiver model that the custom receiver class 235 represents. The PWL waveform can then be used by other simulation program such as SPICE for simulation of smaller design blocks. This is possible only because of the tight integration of the proprietary SerDes modle 210, which enables internal probing of the waveform propagation within the receiver class 240.

The simulation engine builder (or the simulation building system can be programmed to) plug the derived transmitter class 235 and derived receiver class 240 into the simulation platform 145 to generate a simulation engine 250. In some embodiments, the simulation engine builder (or the simulation building system can be programmed to) design the base transmitter class 125 and base receiver class 130 to conform with the specification of the simulation platform 145 such that any transmitter class and receiver class that are derived from the base classes 125 and 130, and then instantiated can work with the simulation platform 145 to generate a simulation engine that models after a SerDes design using the corresponding transmitter and receiver designs. In this example, the resulting simulation engine 250 models after a SerDes design that includes the transmitter design from the proprietary SerDes model 205 and the receiver design from the proprietary SerDes model 210.

Figure 3:
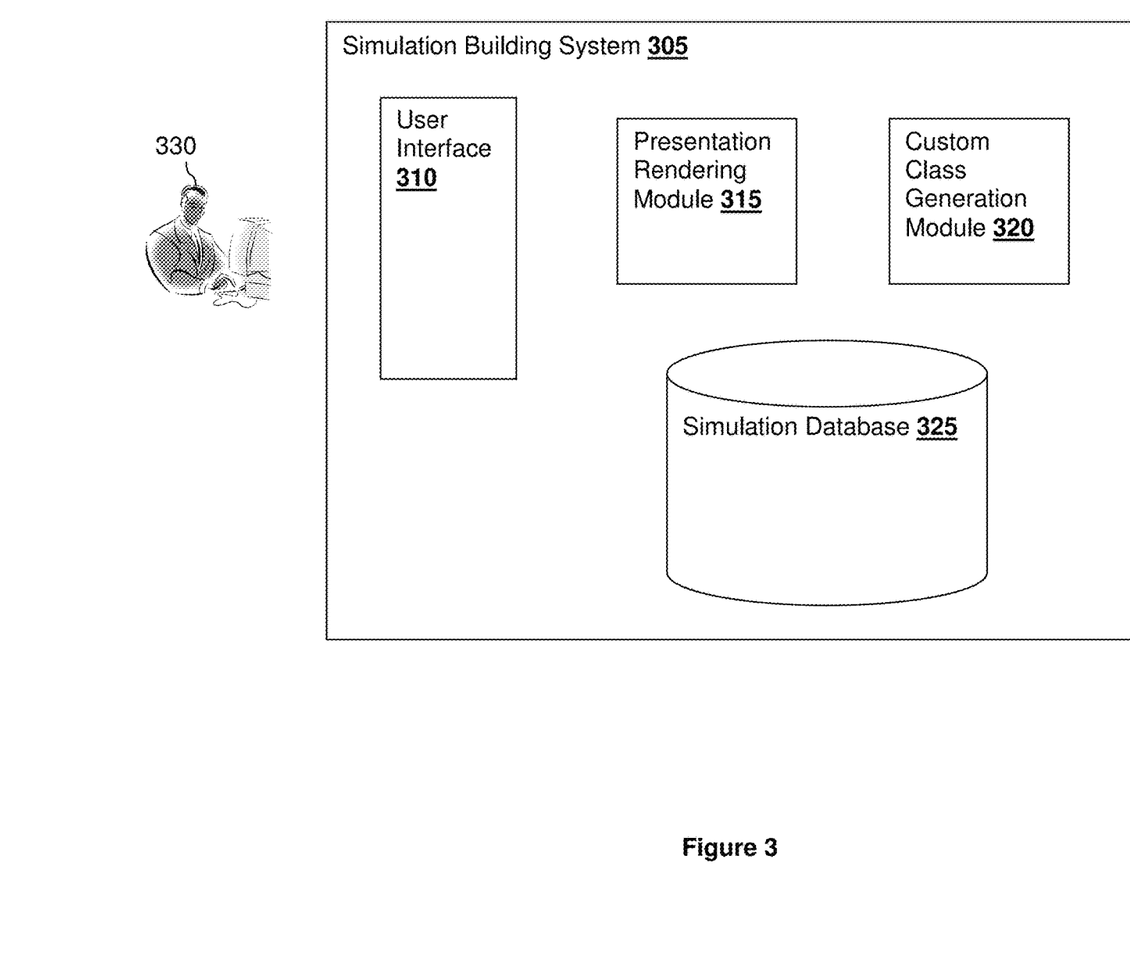
FIG. 3 illustrates the software architecture of a simulation building system of some embodiments.

As mentioned above, it is contemplated that either the simulation engine builder can manually implement the custom component classes based on the proprietary SerDes models, or the simulation building system is programmed to automatically implement the custom component classes based on the proprietary SerDes models. FIG. 3 illustrates a software architecture diagram of an example simulation building system 305. The simulation building system 305 includes a user interface 310, a presentation rendering module 315, a custom class generation module 320, and a simulation database 325.

The simulation database 325 of some embodiments is programmed to store definitions of the base component classes, such as the base transmitter class 125 and the base receiver class 130. The definitions of the base component classes include information about the variables within the base component classes, the different function call interfaces of the base component classes etc. The simulation database 325 is also programmed to store rules that govern how to implement a custom component class based on a standard component model (e.g., a transmitter or receiver model that conforms with the IBIS-AMI standard, etc.), and rules that govern how to implement a custom component class based on portions of the source code from a proprietary SerDes model that are identified to correspond to a particular characteristic of a component design.

In some embodiments, the simulation building system 305 can be implemented as part of the simulation platform 145. The simulation building system 305 of some embodiments is programmed to provide a user interface (e.g., a graphical user interface, a command line interface, etc.) to interact with a simulation engine builder (e.g., simulation engine builder 330). In some embodiments, the simulation building system 305 is programmed to receive a standard component model (e.g., a IBIS-AMI transmitter model) via the user interface 310 from the simulation engine builder 330, and use the custom class generation module 320 to implement and derive a custom component class from either the base transmitter class 125 or the base receiver class 130 according to the rules stored in the simulation database 325.

In some embodiments, the simulation building system 305 is also programmed to receive a proprietary SerDes model from the simulation engine builder 330 via the user interface 310. In some of these embodiments, the presentation rendering module 315 is programmed to render a graphical representation (e.g., nodes and links) that represents that proprietary SerDes model, and present the rendered graphical representation to the simulation engine builder 330 via the user interface 310. The simulation building system 305, via the graphical representation, enables the simulation engine builder to identify different portions of the proprietary SerDes model that corresponds to different characteristics of a particular component. Based on the identification, the simulation building system 305 is programmed to use the custom class generation module 320 to implement and derive a custom component class from either the base transmitter class 125 or the base receiver class 130 according to the rules stored in the simulation database 325.

Figure 4:
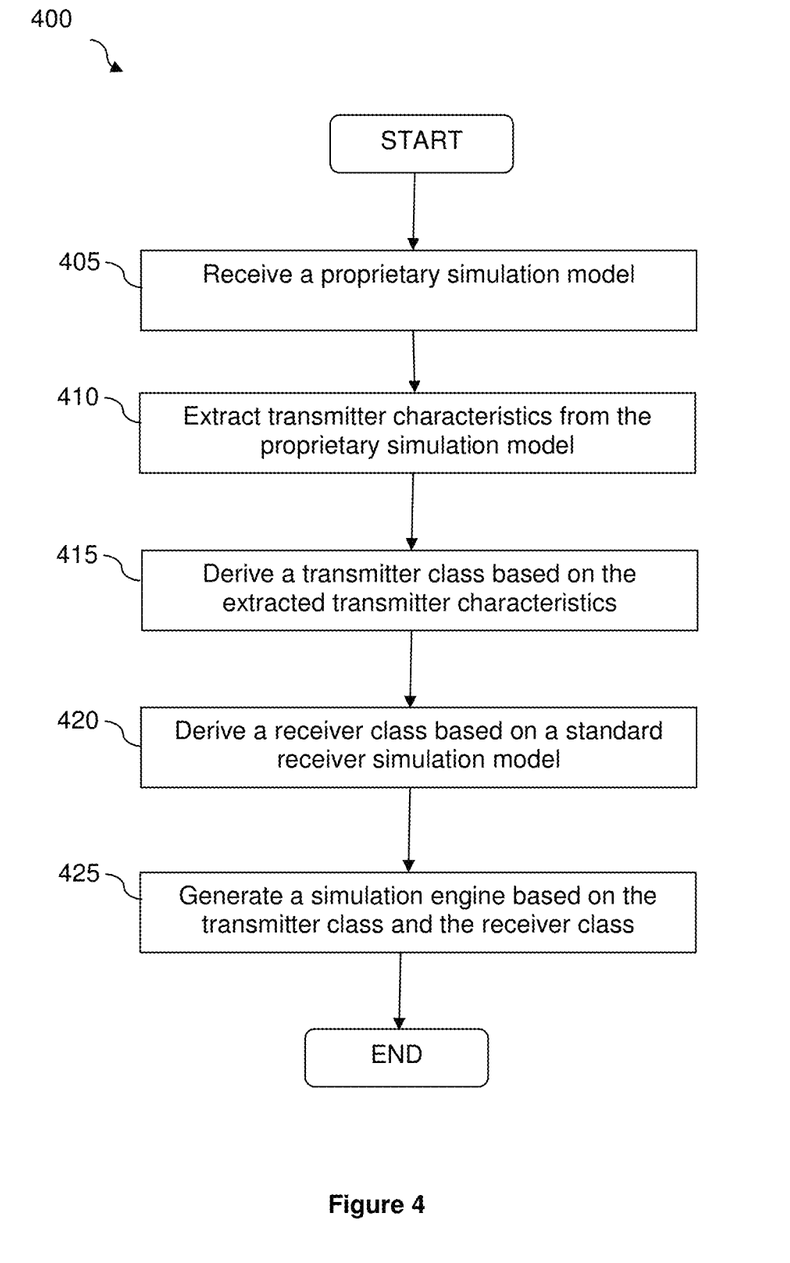
FIG. 4 illustrates a process for generating a simulation engine based on a transmitter design from a proprietary SerDes model and a receiver design from a standard receiver model.

FIG. 4 illustrates a process 400 for generating a simulation engine using a transmitter design from a proprietary SerDes model and a receiver design from a standard receiver model. The process 400 can be performed by either the simulation engine builder or the simulation building system. The process 400 begins by receiving (at step 405) a proprietary SerDes model. The process 400 then extracts (at step 410) transmitter characteristics from the proprietary SerDes model, and then derive (at step 415) a custom transmitter class from a base transmitter class based on the extracted transmitter characteristics. In addition to deriving the custom transmitter class, the process 400 also derives (at step 420) a custom receiver class from a base receiver class based on a standard receiver model such as an IBIS-AMI model. The process 400 then generates (at step 425) a simulation engine based on the derived custom transmitter class and the derived custom receiver class.

Figure 5:
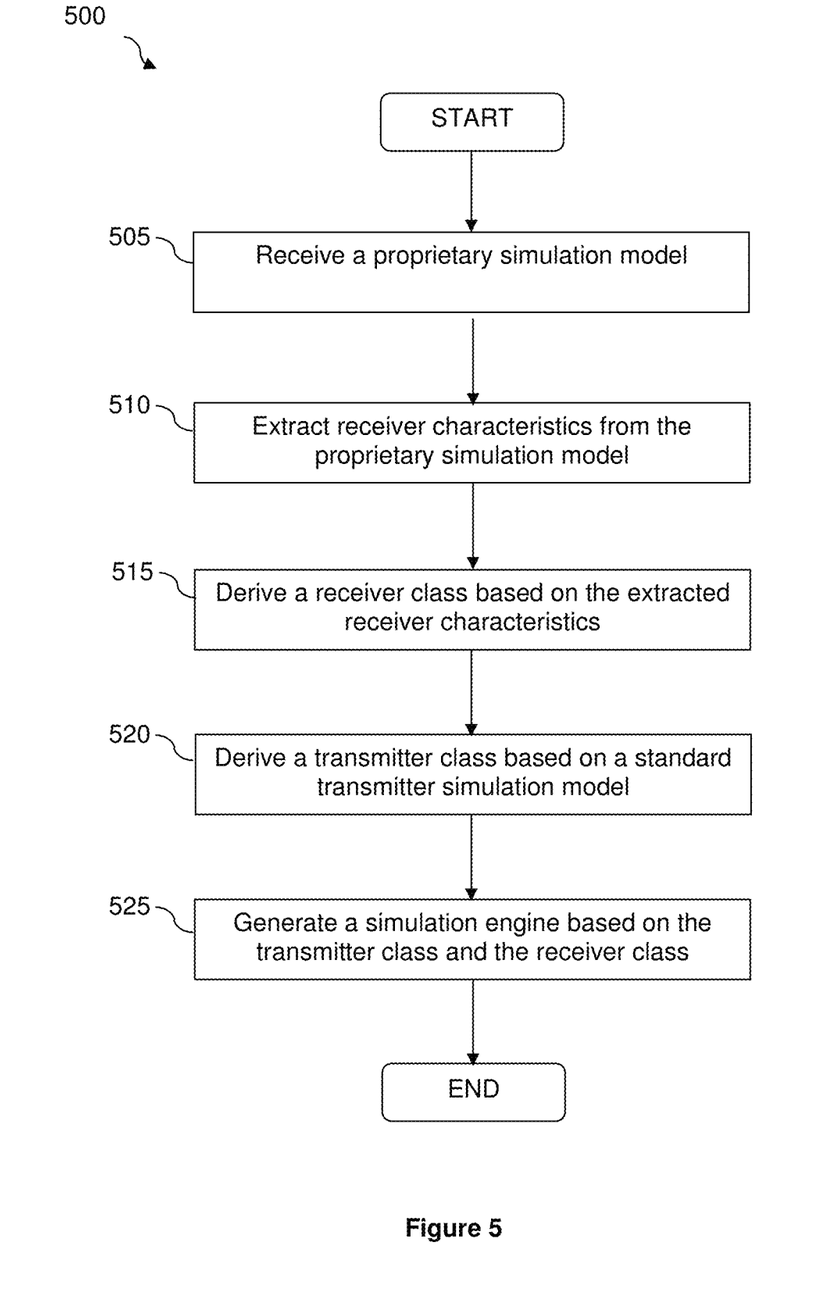
FIG. 5 illustrates a process for generating a simulation engine based on a transmitter design from a standard transmitter model and a receiver design from a proprietary SerDes model.

FIG. 5 illustrates a process 500 for generation a simulation engine using a transmitter design from a standard transmitter model and a receiver design from a proprietary SerDes model. The process 500 can be performed by either the simulation engine builder or the simulation building system. The process 500 begins by receiving (at step 505) a proprietary SerDes model. The process 500 then extracts (at step 510) receiver characteristics from the proprietary SerDes model, and then derive (at step 515) a custom receiver class from a base receiver class based on the extracted receiver characteristics. In addition to deriving the custom receiver class, the process 500 also derives (at step 520) a custom transmitter class from a base transmitter class based on a standard transmitter model such as an IBIS-AMI model. The process 500 then generates (at step 525) a simulation engine based on the derived custom transmitter class and the derived custom receiver class.

Figure 6:
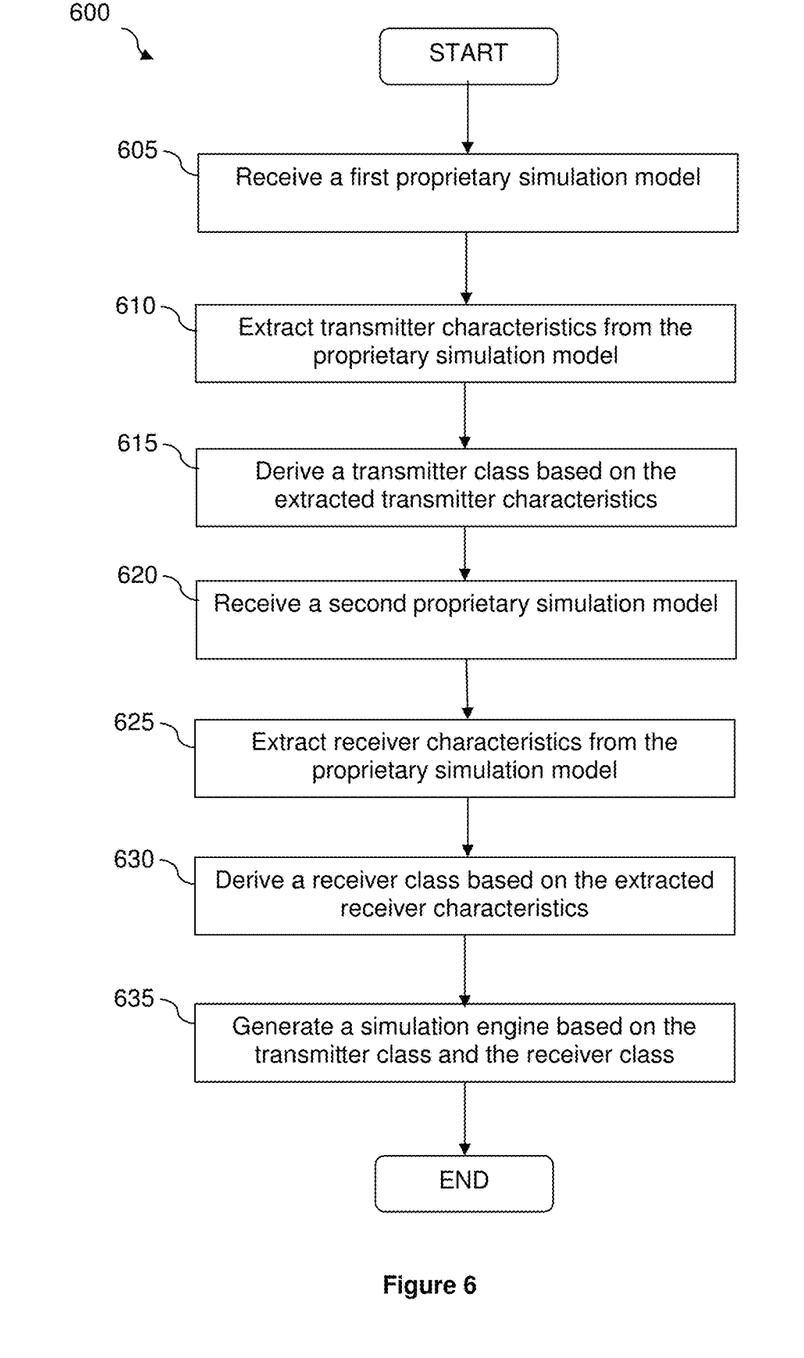
FIG. 6 illustrates a process for generating a simulation engine based on a transmitter design and a receiver design from two different proprietary SerDes models.

FIG. 6 illustrates a process 600 for generation a simulation engine using a transmitter design from a proprietary SerDes model and a receiver design from a different proprietary SerDes model. The process 600 can be performed by either the simulation engine builder or the simulation building system. The process 600 begins by receiving (at step 605) a first proprietary SerDes model. The process 600 then extracts (at step 610) transmitter characteristics from the first proprietary SerDes model, and then derive (at step 615) a custom transmitter class from a base transmitter class based on the extracted transmitter characteristics.

The process 600 also receives (at step 620) a second proprietary simulation model. The process 600 then extracts (at step 625) receiver characteristics from the second proprietary SerDes model, and then derive (at step 630) a custom receiver class from a base receiver class based on the extracted receiver characteristics. The process 600 then generates (at step 635) a simulation engine based on the derived custom transmitter class and the derived custom receiver class.

Figure 7:
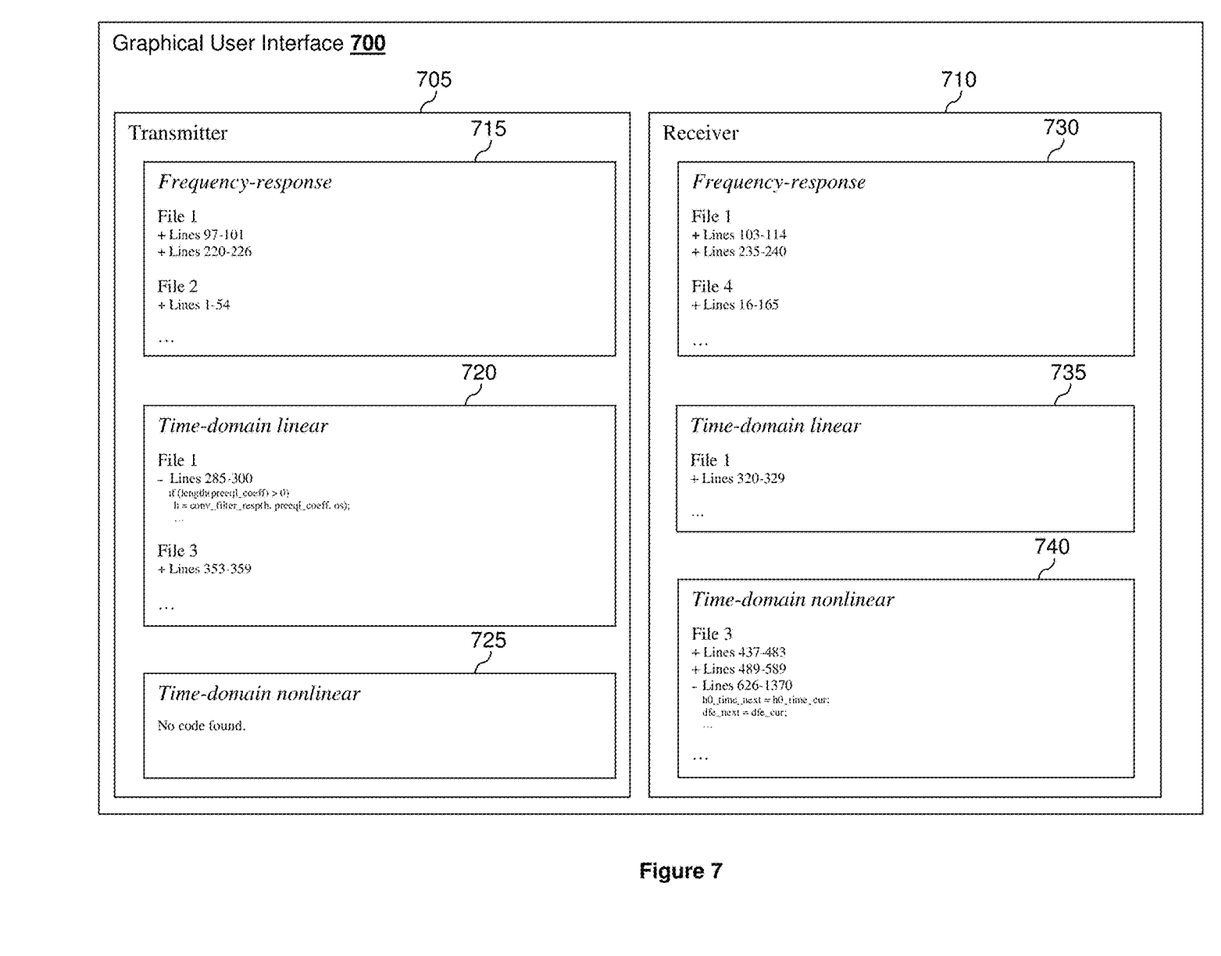
FIG. 7 illustrates an example graphical representation of a transmitter model and a receiver model generated by a simulation building system of some embodiments.

FIG. 7 illustrates an example graphical user interface 700 that a simulation building system of some embodiments provides to assist a simulating engine builder to implement the custom transmitter class and/or the custom receiver class. After receiving the source codes of the proprietary transmitter model and the proprietary receiver model, the simulation building system is programmed to parse the source codes to identify different portions of the source codes that relate to different characteristics of the proprietary transmitter and proprietary receiver models. In some embodiments, the simulation building system is programmed to aggregate source codes that are related to each characteristic (sometimes from multiple source code files) and present to the simulation engine builder. As shown in the figure, the simulation building system renders a presentation of the transmitter/receiver characteristics by presenting the aggregated source codes related to transmitter characteristics in an area 705 and presenting the aggregated source codes related to receiver characteristics in an area 710 of the user interface 700.

Within each of the areas 705 and 710, the simulation building system of some embodiments is programmed to present the source codes divided based on their related characteristics. For example, within area 705, the simulation building system of some embodiments groups source codes that are related to frequency-response characteristic from the proprietary transmitter model (including in this example, lines 97-101 of File 1, Lines 1-54 of File 2, etc.) and presents the source codes as a group in area 715, and the simulation building system also groups source codes that are related to time-domain linear characteristic from the proprietary transmitter model (including in this example, lines 285-300 of File 1, Lines 353-359 of File 3, etc.) and presents the source codes as a group in area 720. When no source code is found related to a certain characteristics, the simulation building system is programmed to indicate as such, as shown in area 725 for the time-domain nonlinear characteristic.

In the area 710, the simulation building system groups source codes that are related to frequency-response characteristic from the proprietary receiver model (including in this example, lines 103-114 and 235-240 of File 1, Lines 16-165 of File 4, etc.) and presents the source codes as a group in area 730, the simulation building system also groups source codes that are related to time-domain linear characteristic from the proprietary receiver model (including in this example, lines 320-329 of File 1, etc.) and presents the source codes as a group in area 735, and the simulation building system also groups source codes that are related to time-domain non-linear characteristic from the proprietary receiver model (including in this example, lines 437-483, 489-589, and 626-1370 of File 3, etc.) and presents the source codes as a group in area 740.

In some embodiments, the simulation building system is also programmed to enable the simulation engine builder to compress and decompress groups of source code for easy viewing. The presentation of source codes grouped based on the related characteristics enables the simulation engine builder to reference or copy portions of the source codes and use them in implementing the custom classes.

In another aspect of the inventive subject matter, a SerDes simulation engine that performs pulse response truncation is presented. In some embodiments, the SerDes simulation engine is programmed to perform pulse response truncation in order to avoid introducing noise from the non-zero pre-cursor and post-cursor tails of the channel pulse response. Because the computed system transfer function inevitably has limited accuracy due to the minimum frequency resolution and the lowest frequency able to be accurately characterized in the models, the conversion into the time-domain can result in a non-physical long tail in the pulse response. Thus, in some embodiments, the SerDes simulation engine is programmed to automatically truncate the pulse response based on a proportional tap tolerance or based on specified pre-cursor and post-cursor unit interval (UI) lengths. Furthermore, the SerDes simulation engine of some embodiments is programmed to capture the full through and crosstalk channel pulse responses for review to check that significant crosstalk taps are not removed by the truncation window.

It should be apparent to those skilled in the art that many more modifications besides those already described are possible without departing from the inventive concepts herein. The inventive subject matter, therefore, is not to be restricted except in the scope of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A method of generating a simulation engine that simulates a link design using a proprietary component model and a standard component model, the method comprising:
   receiving a first proprietary simulation model that models a first complete link design comprising a first transmitter design, a first channel design, and a first receiver design;
   extracting transmitter characteristics from the first proprietary simulation model that correlate to the first transmitter design;
   deriving a first proprietary transmitter class from a base transmitter class based on the extracted transmitter characteristics;
   deriving a standard receiver class from a base receiver class based on a standard receiver simulation model; and
   generating a simulation engine by instantiating a transmitter object as the proprietary component model and a receiver object as the standard component model based on the derived first proprietary transmitter class and the derived standard receiver class, respectively, wherein an output of the transmitter object feeds into the input of the receiver object via a second channel design.

2. The method of claim 1, wherein extracting the transmitter characteristics comprises:
   identifying an output driver impedance point in the first proprietary simulation model; and
   extracting signal transformation characteristics in the first proprietary simulation mode before the output driver impedance point.

3. The method of claim 1, wherein extracting the transmitter characteristics from the first proprietary simulation model comprises:
   extracting both linear and non-linear effects of the transmitter design from the first proprietary simulation model; and
   extracting time-domain characteristics of the first transmitter design from the first proprietary simulation model, wherein the time-domain characteristics comprise linear effects.

4. The method of claim 3, wherein deriving the first proprietary transmitter class from the base transmitter class comprises using the extracted time-domain characteristics to populate properties of the first proprietary transmitter class.

5. The method of claim 1, further comprising implementing, within the first proprietary transmitter class, a jitter generation module that converts a phase locked-loop (PLL) power spectral density to a probability density function and generates jitter in the time-domain of the first proprietary transmitter class based on the probability density function, wherein the PLL power spectral density is generated using spectral profiles of a noise source of the first transmitter design and block level transfer functions of the first transmitter design.

6. The method of claim 1, wherein extracting the transmitter characteristics comprises extracting frequency-domain characteristics of the first transmitter design from the first proprietary simulation model and wherein deriving the first proprietary transmitter class from the base transmitter class comprises using the extracted frequency-domain characteristics to populate properties of the first proprietary transmitter class.

7. The method of claim 1, wherein the standard receiver simulation model conforms to an Input/output Buffer Information Specification-Algorithmic Modeling Interface (IBIS-AMI) model.

8. The method of claim 1, wherein the first proprietary simulation model fails to conform to any industry standard and wherein the first transmitter design, the first channel design, and the first receiver design are inter-mingled within the first proprietary simulation model.

9. The method of claim 1, further comprising implementing, within the first proprietary transmitter class, a piecewise linear (PWL) waveform outputting module that outputs a PWL waveform at an intermediate point within the proprietary component model.

10. A system that generating a simulation engine that simulates a link design using a proprietary component model and a standard component model, comprising a non-transitory computer-readable medium storing instructions that, when executed by a computer processor, cause the computer processor to perform the steps of:
   receiving a first proprietary simulation model that models a first complete link design comprising a first transmitter design, a first channel design, and a first receiver design;
   extracting receiver characteristics from the first proprietary simulation model that correlate to the first receiver design;
   deriving a first proprietary receiver class from a base receiver class based on the extracted receiver characteristics;
   deriving a standard transmitter class from a base transmitter class based on a standard transmitter simulation model; and
   generating a simulation engine by instantiating a receiver object as the proprietary component model and a transmitter object as the standard component model based on the derived first proprietary receiver class and the derived standard transmitter class, respectively, wherein an output of the transmitter object feeds into the input of the receiver object via a second channel design.

11. The system of claim 10, wherein the step of extracting the receiver characteristics comprises:
identifying an input termination network point in the first proprietary simulation model; and
extracting signal transformation characteristics in the first proprietary simulation model after the input termination network point.

12. The system of claim 10, wherein the step of extracting the receiver characteristics from the first proprietary simulation model comprises (i) extracting both linear and non-linear effects of the receiver design from the first proprietary simulation model and (ii) extracting time-domain characteristics of the first receiver design from the first proprietary simulation model, wherein the time-domain characteristics comprise non-linear effects.

13. The system of claim 12, wherein the step of deriving the first proprietary receiver class from the base receiver class comprises using the extracted time-domain characteristics to populate properties of the first proprietary receiver class.

14. The system of claim 10, wherein the step of extracting the receiver characteristics comprises extracting frequency-domain characteristics of the first receiver design from the first proprietary simulation model and wherein the step of deriving the first proprietary receiver class from the base receiver class comprises using the extracted frequency-domain characteristics to populate properties of the first proprietary receiver class.

15. The system of claim 10, wherein the non-transitory computer-readable medium further stores instructions that, when executed by the computer processor, cause the computer processor to perform the steps of implementing, within the first proprietary receiver class, a piecewise linear (PWL) waveform outputting module that outputs a PWL waveform at an intermediate point within the proprietary component model.

16. The system of claim 10, wherein the standard transmitter simulation model conforms to an Input/output Buffer Information Specification-Algorithmic Modeling Interface (IBIS-AMI) model.

17. The system of claim 10, wherein the first proprietary simulation model fails to conform to any industry standard.

18. A computer system for generating a simulation engine that simulates a link design using proprietary component models from different link designs, the computer system comprising:
a user interface programmed to:
receive a first proprietary simulation model that models a first complete link design comprising a first transmitter design, a first channel design, and a first receiver design, and
receive a second proprietary simulation model that models a second complete link design comprising a second transmitter design, a second channel design, and a second receiver design; and
a computer processor programmed to:
extract transmitter characteristics from the first proprietary simulation model that correlate to the first transmitter design,
derive a first proprietary transmitter class from a base transmitter class based on the extracted transmitter characteristics,
extract receiver characteristics from the second proprietary simulation model that correlate to the second receiver design,
derive a first proprietary receiver class from a base receiver class based on the extracted receiver characteristics, and
generating a simulation engine by instantiating a transmitter object and a receiver object as the proprietary component models based on the derived first proprietary transmitter class and the derived first proprietary receiver class, respectively, wherein an output of the transmitter object feeds into the input of the receiver object via a third channel design.

19. The computer system of claim 18, wherein the third channel design is different from both the first and second channel designs.

20. The computer system of claim 18, wherein both the first and second proprietary simulation models fail to conform to any industry standard.

* * * * *